United States Patent
Salzmann et al.

(10) Patent No.: US 7,236,002 B2
(45) Date of Patent: Jun. 26, 2007

(54) DIGITAL CMOS-INPUT WITH N-CHANNEL EXTENDED DRAIN TRANSISTOR FOR HIGH-VOLTAGE PROTECTION

(75) Inventors: Oliver Salzmann, Merklingen (DE); Rainer Krenzke, Esslingen (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 108 days.

(21) Appl. No.: 11/231,673

(22) Filed: Sep. 21, 2005

(65) Prior Publication Data

US 2007/0057694 A1 Mar. 15, 2007

(30) Foreign Application Priority Data

Sep. 15, 2005 (EP) .................................. 05368015

(51) Int. Cl.
*H03K 19/007* (2006.01)
(52) U.S. Cl. .......................................... 326/14; 326/83
(58) Field of Classification Search ................. 326/14, 326/80–90; 327/545–546
See application file for complete search history.

(56) References Cited

U.S. PATENT DOCUMENTS

| | | | |
|---|---|---|---|
| 6,169,432 B1 | 1/2001 | Sharpe-Geisler | 327/112 |
| 6,181,193 B1 | 1/2001 | Coughlin, Jr. | 327/534 |
| 6,320,408 B1 * | 11/2001 | Kwong | 326/31 |
| 6,441,670 B1 * | 8/2002 | Coughlin et al. | 327/323 |
| 6,452,440 B2 | 9/2002 | Rapp | 327/543 |
| 6,781,415 B2 * | 8/2004 | Clark et al. | 326/81 |
| 6,856,168 B2 | 2/2005 | Oertle et al. | 326/81 |
| 2006/0103427 A1 * | 5/2006 | Bhattacharya et al. | 326/83 |

OTHER PUBLICATIONS

An Internal Technical Report by Rainer Krenzke et al., of Oct. 2004, "A 36-V H-Bridge Driver Interface in a Standard 0.35-μm CMOS Process".

* cited by examiner

*Primary Examiner*—Rexford Barnie
*Assistant Examiner*—Jason Crawford
(74) *Attorney, Agent, or Firm*—Saile Ackerman LLC; Stephen B. Ackerman

(57) ABSTRACT

A circuit and a method are given, to realize an electronic system for combined usage at differing voltage ranges as defined by a low-voltage range for operating standard CMOS devices and a high-voltage range exceeding said standard CMOS low-voltage operating range significantly by multiples and thus necessarily utilizing input ports with an intrinsic high-voltage protection feature. Said circuit and method are designed in order to be implemented with a very economic number of components, capable to be realized with standard modern integrated circuit technologies in CMOS technology.

25 Claims, 6 Drawing Sheets

High-Voltage NMOS Cross Section

High-Voltage PMOS Cross Section

DIGITAL CMOS-INPUT WITH N-CHANNEL EXTENDED DRAIN TRANSISTOR FOR HIGH-VOLTAGE PROTECTION

BACKGROUND OF THE INVENTION

1. Field of the Invention

The present invention relates generally to electronic circuits for higher voltages and in particular to protect low voltage circuits realized with integrated-circuit technologies. Somewhat more in particular the current invention is also relating to switch controller circuits and more particularly, to integrated circuits for motor bridge interfaces, and even more particularly to circuits controlling MOS power transistors within an H-bridge configuration for DC-motor driving applications.

2. Description of the Prior Art

In many technical fields, where automation is of the utmost importance in order to reach a comfortable and reliable operation for users, like production of modern vehicles, manufacture of electrical and electronical household appliances, data processing or computing devices and telecommunications equipment, or industrial use of precision tooling machines etc. nowadays mixed signal integrated circuits are playing a key role especially when it comes to circuits equally apt for processing data and evaluating signals out of lower and higher voltage ranges within one single chip. The expression 'mixed signal' thereby signifying the ability for processing of analog and digital signals by one and the same integrated circuit, which is per se a rather demanding task.

Realizations of the prior art for such circuits are often implemented as specifically tailored semiconductor circuits or chip sets, fulfilling the operational demands regarding the higher voltages or currents supplied. Therefore, when higher voltage operations take place sometimes DMOS (Double Diffused MOS) transistor devices are used, making necessary an expensive process in semiconductor fabrication. Alternatively CMOS devices with extended drain realizations are employed, but when used in a differential input pair transistor configuration, high $V_{GS}$ (Gate-Source) values for the transistors have to be specified, which leads also to more expensive components. Logic circuits or even microprocessor systems normally are working with low voltages. The composition into one chip of these two voltage domains—one for higher, the other for lower voltages—has to be made in such a way, that no detrimental influences are affecting onto each other. Thereto an appropriately combined semiconductor technology capable of handling all these demands is chosen, which also most often leads to costly solutions. The challenge for the designer of such circuits is therefore to find a reliable, efficient and cost effective solution. Using transistors in bipolar or in Double Diffused MOS (DMOS) technology is the current state of manufacture in industry. These technologies are expensive however and it is desirable to find solutions that are less expensive.

In the prior art, there are different technical approaches for achieving the goal of securely operating an integrated circuit under high and low voltage conditions affecting their input pins. However these approaches use often solutions, which are somewhat technically complex and therefore also expensive in production. It would be advantageous to reduce the expenses in both areas. This is achieved by using a voltage supervising technique for the actual input voltage domain acting at the input pins concerned in conjunction with a protection switch for the internal low voltage circuit parts of the chip. The protection switch itself realized as Field Effect Transistor (FET) implemented in extended drain technology. Using the intrinsic advantages of that solution—as described later on in every detail—the circuit of the invention is realized with standard CMOS technology at low cost.

Preferred prior art realizations are implementing protection means differently, more complex in function and more expensive in production. It is therefore a challenge for the designer of such circuits to achieve a high-quality, but lower-cost solution. There are various patents referring to such solutions.

U.S. Pat. No. 6,169,432 (to Sharpe-Geisler) proposes a high voltage switch for providing voltages higher than 2.5 volts with transistors made using a 2.5 volt process whereby a voltage switch is provided made up of 2.5 volt process transistors which tolerate a maximum gate to source, gate to drain, or drain to source voltage of 2.7 volts. The voltage switch transistors are arranged to switch between a voltage, such as 2.5 volts, and a much higher voltage, such as 4.5 volts. In one embodiment of the switch, the voltage switch includes an input provided to the source of an NMOS cascode connected transistor N2. An inverter connects the source of the NMOS cascode N1 to the source of another NMOS cascode N2. A cascode transistor is defined as being connected so that it is turned on and off by varying source voltage with the gate voltage fixed, rather than varying gate voltage. Gates of the cascodes (N1, N2) are connected to Vcc (2.5 volts). PMOS cascode transistors P2 and P3 connect the drains of respective cascode transistors N1 and N2 to PMOS transistors P3 and P4. The PMOS transistors P3 and P4 have sources connected to 4.5 volts. A PMOS transistor P5 has a gate tied to the drain of cascode N2 and provides Vcc to the switch output. A PMOS transistor P6 has a gate tied to the gate of transistor P4 and supplies 4.5 volts to the said switch output. In operation, the switch functions to selectively transition its output between Vcc and 4.5 volts without applying greater than 2.7 volts from the gate to source, gate to drain, or source to drain of any of its transistors.

U.S. Pat. No. 6,181,193 (to Coughlin, Jr.) presents using thick-oxide CMOS devices to interface high voltage integrated circuits, especially a high voltage tolerant CMOS input/output interface circuit. In this circuit, a process feature called "dual-gate" or "thick-oxide" process is used on any devices that will be exposed to high voltage. The thick-oxide devices have a larger capacitance and lower bandwidth, and therefore, preferably, they are only used where exposure to high voltage can cause damage. The remaining devices on the interface circuit may all use a standard process with the thinner oxide, allowing the I/O and the core IC to run at maximum speed. The circuit design topology also limits the number of devices that are exposed to high voltage. Preferably, the protection scheme is broken down into two parts: the driver and receiver.

U.S. Pat. No. 6,452,440 (to Rapp) shows a voltage divider circuit, wherein a charge pump system includes a charge pumping circuit for outputting a high voltage $V_{pp}$ at a node. An oscillator circuit, coupled to the charge pumping circuit, drives the charge pumping circuit with at least one clock signal. A current source generates a pulldown current. A voltage divider circuit is coupled between the node and the current source. The voltage divider circuit cooperates with the current source to form a feedback loop for controlling the oscillator circuit to run at variable, optimum frequency for controlling the rate-of-rise and the amplitude of the voltage $V_{pp}$ while minimizing power-supply current drain.

U.S. Pat. No. 6,856,168 (to Oertle et al) introduces a 5 Volt tolerant IO scheme using low-voltage devices wherein systems and methods are disclosed for operating a core circuitry of an integrated circuit at a lower voltage than the coupled IO circuitry using a tolerant circuit. In one embodiment includes a voltage tolerant circuit comprising a voltage detect module adapted to detect when a voltage is sufficient to switch bias conditions without violating maximum transistor operating conditions and a comparator adapted to detect when a PAD voltage is greater than an IO power supply voltage.

Although these patents and papers describe circuits and/or methods close to the field of the invention they differ in essential features from the method, the system and especially the circuit introduced here.

SUMMARY OF THE INVENTION

A principal object of the present invention is to realize a circuit for implementing an input port with an intrinsic high-voltage protection feature in form of very manufacturable integrated circuits at low cost.

Another principal object of the present invention is to provide an effective and very manufacturable method to implement circuits for signal processing, control operations, automation and computing and the like comprising low-voltage and high-voltage circuit blocks and incorporating input port devices for digital and/or analog input signals.

Another further object of the present invention is to attain a protection of low-voltage circuits against much higher voltages by evaluating signals out of different voltage domains for controlling a single protection FET for the low-voltage circuit parts.

Another still further object of the present invention is to reach said evaluation by simply controlling the gate voltage of said protection FET, whereby the high-voltage input connects to the drain and the protected low-voltage domain is linked to the source of said protection FET.

Further another object of the present invention is to give a method featuring the design of a high-voltage input port protection for low-voltage circuits, whereby the low-voltage parts are operating only with low-voltage signals.

Another further object of the present invention is to reduce the cost of manufacturing by implementing the circuit as a monolithic integrated circuit in low cost CMOS technology.

Also an object of the present invention is to reach a low-cost realization with modern integrated circuit technologies where a combined usage of high and low voltages on a port/circuit is realized using only CMOS devices.

Another still further object of the present invention is to reduce cost by using only CMOS devices, therefore making use of very economic chip design and production only in one technology with no additional process steps or devices other than CMOS.

In accordance with the objects of this invention a new circuit is described, capable of realizing an electronic system for combined usage at differing voltage ranges as defined by a low-voltage range or domain for operating standard CMOS devices and a high-voltage range or domain providing voltages exceeding said standard CMOS low-voltage operating range significantly, comprising: a low-voltage circuit block being operated at said low-voltage domain and having a low-voltage input and a low-voltage output; a high-voltage input port or terminal for input signals including voltages up to said high-voltage range thus operating in said high-voltage domain; a protection switch in form of an extended-drain enhanced low-voltage CMOS FET for said high-voltage input port and designated as HV-CMOS port FET connected with its drain to said high-voltage input and with its source to said low-voltage input; a gate voltage circuit for setting the gate voltage of said HV-CMOS port FET and connected to said gate of said HV-CMOS port FET; a pull-up circuit or component for clamping the source voltage of said HV-CMOS port FET to a secure state in case said HV-CMOS port FET is switched off and thus connected to said source of said HV-CMOS port FET; an enable circuit for controlling said pull-up component for said HV-CMOS port FET and thus connected on one side to said pull-up circuit or component and on another side to said low-voltage output; power supply terminals providing low-domain voltages for feeding said gate voltage, said enable, and said low-voltage circuit blocks as well as said pull-up circuit or component; ground terminals for said circuits and components; and the setting of said gate voltage for said HV-CMOS port FET to a value where said low-voltage input follows the voltage at said high-voltage input for voltages below values 'gate voltage minus threshold voltage' ($V_{gate} - V_{th}$) of the HV-CMOS port FET.

Also in accordance with the objects of this invention a new method is described, capable of implementing an electronic system for combined usage at differing voltage ranges or domains as defined by a low-voltage range for operating standard CMOS devices and a high-voltage range exceeding said standard CMOS low-voltage operating range significantly, comprising: providing a low-voltage circuit block being operated at said low-voltage range; optionally providing a high-voltage circuit block being operated at said high-voltage range; providing a high-voltage input port or terminal for input signals including voltages up to said high-voltage range; providing a protection switch in form of an extended-drain enhanced low-voltage CMOS FET for said high-voltage input port devices and designated as HV-CMOS port FET; providing an enable & control circuit for controlling said protection switch HV-CMOS port FET by gate controlling said HV-CMOS port FET together with pull-up components for said HV-CMOS port FET; providing power supply terminals with low-domain voltages for feeding said low-voltage circuit block; providing power supply terminals with voltages for feeding said high-voltage circuit block; providing power supply terminals for feeding said enable & control circuits; providing for said enable & control circuit an enable pin and first and second control output terminals; connecting the input terminal of said high-voltage input port directly to input pins of said high-voltage circuit block; connecting said input terminal of said input port devices indirectly via said HV-CMOS port FET functioning as protection switch to input pins of said low-voltage circuit block; connecting said high-voltage input terminal of said high-voltage input port to the drain of said HV-CMOS port FET; connecting the source of said HV-CMOS port FET to said input pin of said low-voltage circuit block and to one side of said pull-up component for said HV-CMOS port FET; connecting the other side of said pull-up component for said HV-CMOS port FET with said power supply terminal for feeding said enable & control circuit; connecting said first control output terminal of said enable & control circuit to the gate of its corresponding HV-CMOS port FET; connecting said second control output terminal of said enable & control circuit to a control input of said pull-up component for its corresponding HV-CMOS port FET; arranging within said enable & control circuit a threshold value in order to discriminate between signal voltages out of said low-voltage or said high-voltage domains; controlling by said enable & control circuit the signals of said first and said second control output terminals as a function of said threshold value arranged within said enable & control circuit; operating said CMOS integrated circuit in such a way, that depending on the voltage levels of the signals applied to said high-voltage input port, either a low-voltage or a high-voltage range signal, said low-voltage circuit block is always switched off by said HV-CMOS port FET via an appropriately set first control output signal controlling the gate voltage of said HV-CMOS port FET in case an input port signal out of said high-voltage range is applied; and generating a second control output signal controlling said pull-up component of said HV-CMOS port FET in such a way, that in case of an opened HV-CMOS port FET when said low-voltage circuit block is being switched off, the source of said HV-CMOS port FET is fixed to a secure voltage state where its voltage level cannot float.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiment of the invention discloses a novel circuit for an input port device, which can be used as interface between a high voltage circuit—or a low voltage circuit of course—by protecting the access to internal low voltage CMOS circuit parts of said input port bearing circuit with the help of a low voltage CMOS n-channel transistor with extended drain. In contrast to current practice where low voltage circuits or ports can only be used in the low voltage domain and not together with high voltage applications this solution avoids the disadvantages of providing extra ports or circuits or additional process steps for special protection devices e.g. in DMOS technology in order to enable such high voltage applications.

Figure 1:
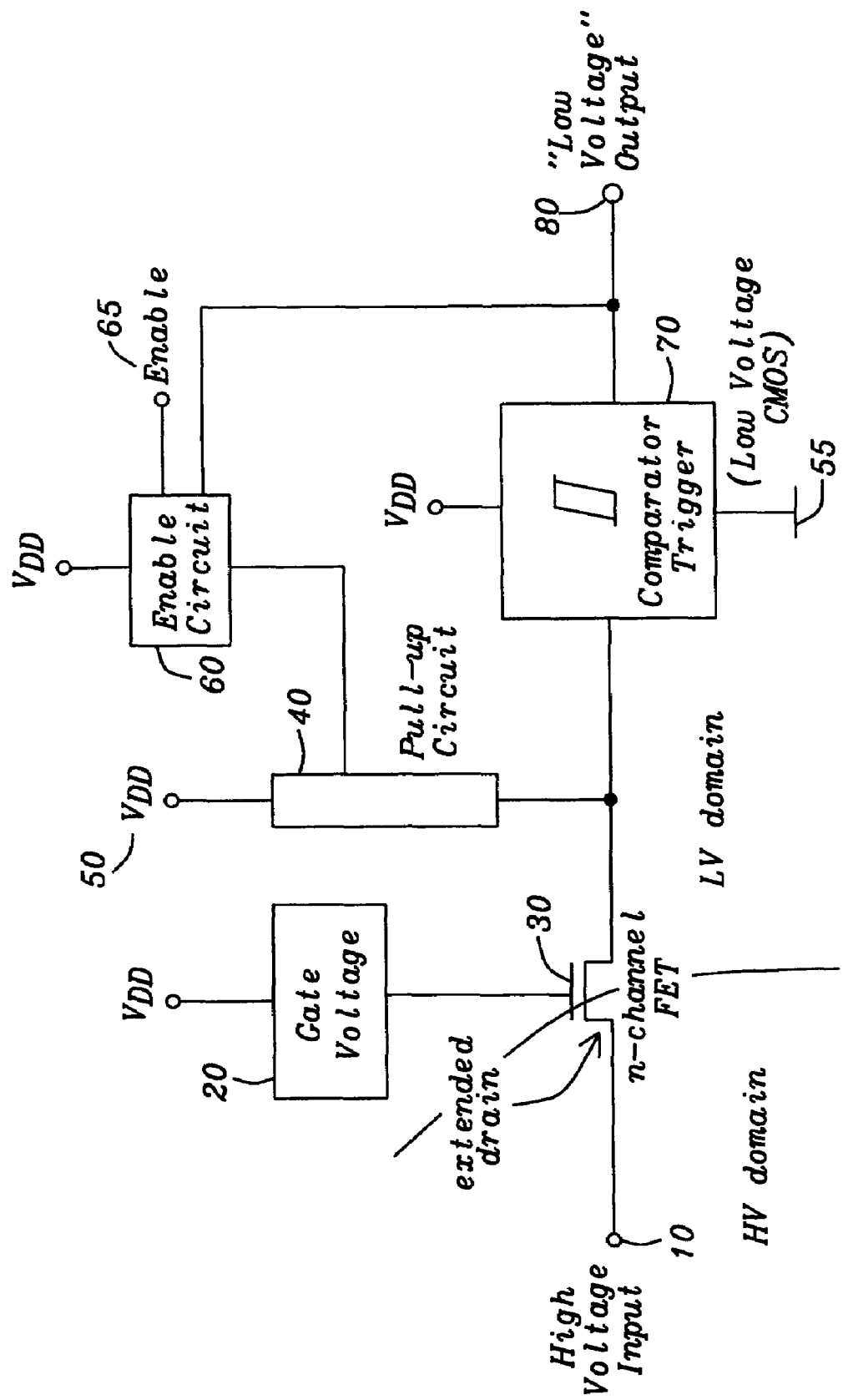
FIG. 1 shows a schematic diagram of the new input port device in a basic configuration as preferred embodiment of the present invention implementable with modern monolithic integrated circuit CMOS technologies.

Looking now at FIG. 1 showing a schematic diagram of the basic circuit of an input port device according to the invention a High Voltage (HV) Input terminal 10 is observed, connected to the drain (implemented in extended drain technology) of a switching FET 30 which as such is still belonging to the HV-domain, with its gate voltage supplied and controlled by block Gate Voltage 20. Said FET 30 operates as protection switch delivering signals situated within the Low Voltage (LV) domain to its source and all following and connected LV-circuits. The transistor 30 is turned on as long as the input voltage is residing below a value 'gate voltage minus threshold voltage' ($V_{gate}-V_{th}$) of this FET, i.e. the operating range of the input voltage depends on the gate voltage of the transistor 30, the higher said gate voltage is the longer the transistor stays turned on whilst the input voltage is rising. However if the input voltage is exceeding this step the transistor is turned off. The implemented Pull-Up Circuit 40 prevents the source node from floating and puts the source to a well defined "Low Voltage" high level of $V_{DD}$. That is, the protection transistor 30 doesn't have to be controlled by a special control circuit—it is switched off automatically by the increasing input voltage at the High Voltage Input port 10. Therefore the invention protects the "Low Voltage" CMOS input and puts the input to a "Low Voltage" high level. The gate voltage of the FET 30 can always be applied unless the High Voltage Input port 10 is to be switched off. An Enable and a Control Circuit block 60 is included, which enables the CMOS circuits e.g. a Schmitt-Trigger 70 and the Pull-Up circuit 40. If, as in the case shown here the "Low Voltage" digital input of the CMOS circuit 70—said Schmitt-Trigger—is to be used, it needs a Pull-Up Circuit 40 as mentioned before. The gate voltage generation and control of the FET 30 has been implemented here within a separate Gate Voltage block 20, but it can also be controlled from the Enable Circuit block 60. Pins 50 are providing the supply voltages $V_{DD}$ of the LV domain, pin 55 is at ground level.

An explanation of dispositions, connections, and interactions of the components and circuit blocks in FIG. 1 is summarized as follows:

1) A protection FET 30 with extended drain protects the components in the Low Voltage (LV) domain against high voltages from the High Voltage (HV) domain. LV—domain supports voltages up to 5V, HV—domain extends up to 40V for instance.
2) The input range at the High Voltage Input 10 can be controlled by the gate voltage of protection FET 30, which means: the lower the gate voltage is, the earlier the transistor turns off whilst the input voltage is rising.
3) The digital "Low Voltage" input of the Schmitt-Trigger 70 sees the input voltages at the High Voltage Input port 10 as long as they don't exceed said input range. When the maximum of said range is exceeded (and the transistor is turned off) this input needs to stick at a defined level, which then indicates that the input level is high, this level is provided by the Pull-Up Circuit 40.
4) The Enable Circuit 60 switches the Pull-Up circuit 40 and the Schmitt-Trigger 70 on or off. The gate voltage can either be controlled separately by block Gate Voltage 20 as in the schematic diagram FIG. 1, in order to switch off the transistor 30 when the low voltage circuit is disabled, or the gate voltage can be set up by controlling it via a combined Enable and Control block.
5) The "Low Voltage" input follows the High Voltage Input for voltages below values 'gate voltage minus threshold voltage' ($V_{gate}-V_{th}$). The digital "Low Voltage" CMOS input never sees a voltage higher than $V_{DD}$ due to the Pull-Up circuit. The gate voltage is not switched off for this purpose. Supply voltage $V_{DD}$ is 5V i.e. "Low Voltage".

The diagram in FIG. 1 represents a preferred embodiment of the present invention implementable with modern monolithic integrated circuit CMOS technologies and described here for the case where the protection switch FET 30 is realized by a low voltage technology n-channel CMOS transistor with extended drain named HV-NMOS FET which protects the "Low Voltage" circuits part 70 (and optionally further LV circuit components connected via "Low Voltage" output 80) if high voltage signals are applied by switching said protection FET off and clamping its source to a "Low Voltage" high level, as a digital input signal for the "Low Voltage" circuit parts.

Figure 2:
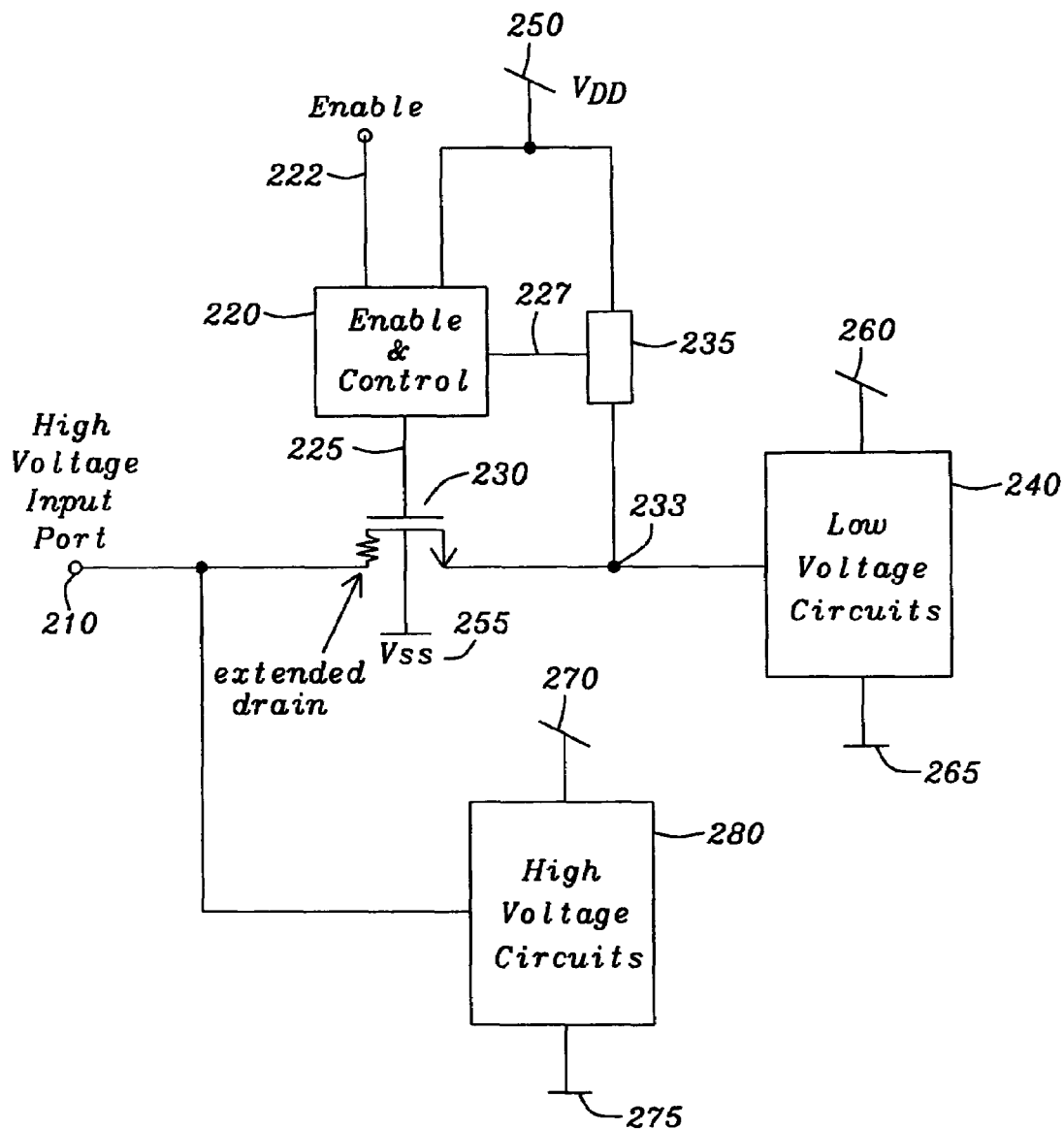
FIG. 2 shows a generalized circuit of an input port device in form of a combined block and circuit diagram (i.e. with separate representation of the protection switch FET and its pull-up device) as usable for applications of the current invention.

Browsing the combined block and circuit diagram of FIG. 2 showing as example for an integration of the new input port device according to the invention into a general application a somewhat more general embodiment shall be evaluated. Starting from said 'Input Port' (item 210) three general circuit blocks (items 220, 240 and 280) can be distinguished being composed together with two discrete devices (items 230 and 235) such forming the new circuit. Said three blocks named 'Enable & Control' 220, 'Low Voltage' circuits 240, and 'High Voltage' circuits 280. Said two discrete devices are operating as protection switch FET 230 with an associated pull-up component 235. The first circuit block is thereby acting as 'Enable & Control' circuit 220, essentially a means for either indirectly supervising the input voltage level at said 'Input Port' 210 and processing external signals via lead 222 named 'Enable' and controlling the gate of said low voltage CMOS n-channel extended drain switching transistor 230 via connection 225 and also controlling said pull-up component 235 for protection switch transistor 230 via lead 227 when CMOS transistor 230 is turned off, said pull-up component implemented for example as a resistor or a transistor connected on one side to a low voltage $V_{DD}$ supply 250 and on its other side 233 to both, the source of FET protection switch 230 and the input to said 'Low Voltage' circuits block 240. Voltage $V_{DD}$ 250 also energizes said 'Enable & Control' circuit 220, point 255 is at ground level $V_{SS}$ and normally bulk connected to FET 230. The additional pins 260 and 265 to circuit block 240—said 'Low Voltage' circuits part to be protected against the influence of high voltages—constitute power supply connections also out of the low voltage domain. The last circuit block 280 represents the 'High Voltage' circuits part within the circuit of the invention, which is supplied by voltages 270 and 275 normally attributed to the high voltage domain and also, but now directly connected to said 'Input Port' (item 210). It shall be mentioned here, that high voltage domain supply voltages may also be generated internally within said 'High Voltage' circuits part 280. The diagram in FIG. 2 has to be understood as another embodiment of the present invention implementable with modern monolithic integrated circuit CMOS technologies and described here for the case where the protection switch FET 230 is realized by a low voltage technology n-channel CMOS transistor with extended drain named HV-NMOS FET which protects the 'Low Voltage' circuits part 240 if high voltage signals are applied by switching them into a well defined state. A complementary realization case with p-channel FET (HV-PMOS FET), but with voltages and signals of inverted polarity shall also be mentioned here and as will be easily understood by those skilled in the art. The invention herewith is presenting a solution of a problem where a combined usage of high and low voltages on a port/circuit is needed using only CMOS devices, therefore making use of very economic chip design and produced only in one technology with no additional process steps or devices other than CMOS.

Figure 3A:
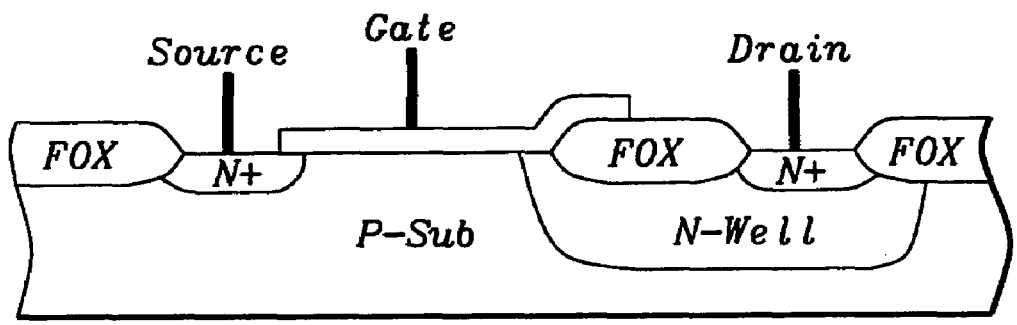
FIGS. 3A & 3B depict with the help of cross sectional diagrams the according transistor structures as extended drain realizations for CMOS FET protection switches for the new input port devices, both in NMOS as well as PMOS implementations.
Figure 3B:
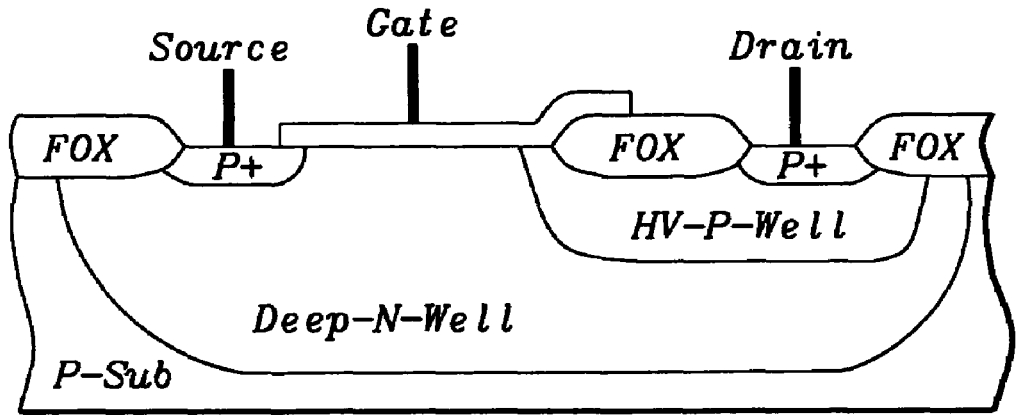

Viewing the cross sectional diagrams of FIGS. 3A & 3B wherein the underlying chip fabrication technology applied here shall be described (for informational purposes only) and where therefore those proposed transistor structures of such extended drain realizations for CMOS FET protection switches for the new input port devices are sketched, and this both in NMOS as well as PMOS implementations for said HV-CMOS realization. FIG. 3A shows the high-voltage NMOS (HV-NMOS) transistor cross section and FIG. 3B shows the high-voltage PMOS (HV-PMOS) transistor cross section. These transistors are based on a 5V technology with an extended drain region in order to reach up to 40V drain-source breakdown capabilities. For the drain region of the HV-NMOS FET of FIG. 3A an N-well has been added, with an additional field oxide (FOX) area to separate the drain from the gate and to form a drift zone. This technique is called 'gate-shifted LDD-MOS' including so-called 'Lightly Doped Drain' (LDD) structures. As the source side of the HV-NMOS FET is the same as is used for standard 5V transistors e.g., its $V_{BS}$ and $V_{GS}$ voltages are limited to 5.5V in our case. The structure of the high-voltage PMOS FET in FIG. 3B is similar to the HV-NMOS FET from FIG. 3A. The drift zone is constructed using an additional high-voltage P-well at the drain side, complementary to the N-well of the HV-NMOS FET of FIG. 3A. The PMOS FET is embedded in a deep N-well that is part of the high-voltage module of the process extension. Most implementations of motor bridge drivers, as examplified here as a possible application, use a multi-technology process which combines bipolar and CMOS control circuitry (BiCMOS). The advantages of integrating high-voltage interfaces in CMOS-only are well understood: lower process cost, analog and digital core integration for interface control, and overall high area efficiency. This leads to extend a standard 0.35-μm CMOS process by two additional high-voltage MOS devices (HV-CMOS) for operation range $V_{GS}$, $V_{BS}$<5.5V and $V_{DS}$<40V under the focus of minimizing the number of additional process steps. The technology used is very cost effective, because the high-voltage module added to a 0.35 μm standard CMOS process comprises only a few steps to make the extended drain high-voltage MOS transistors.

Figure 4A:
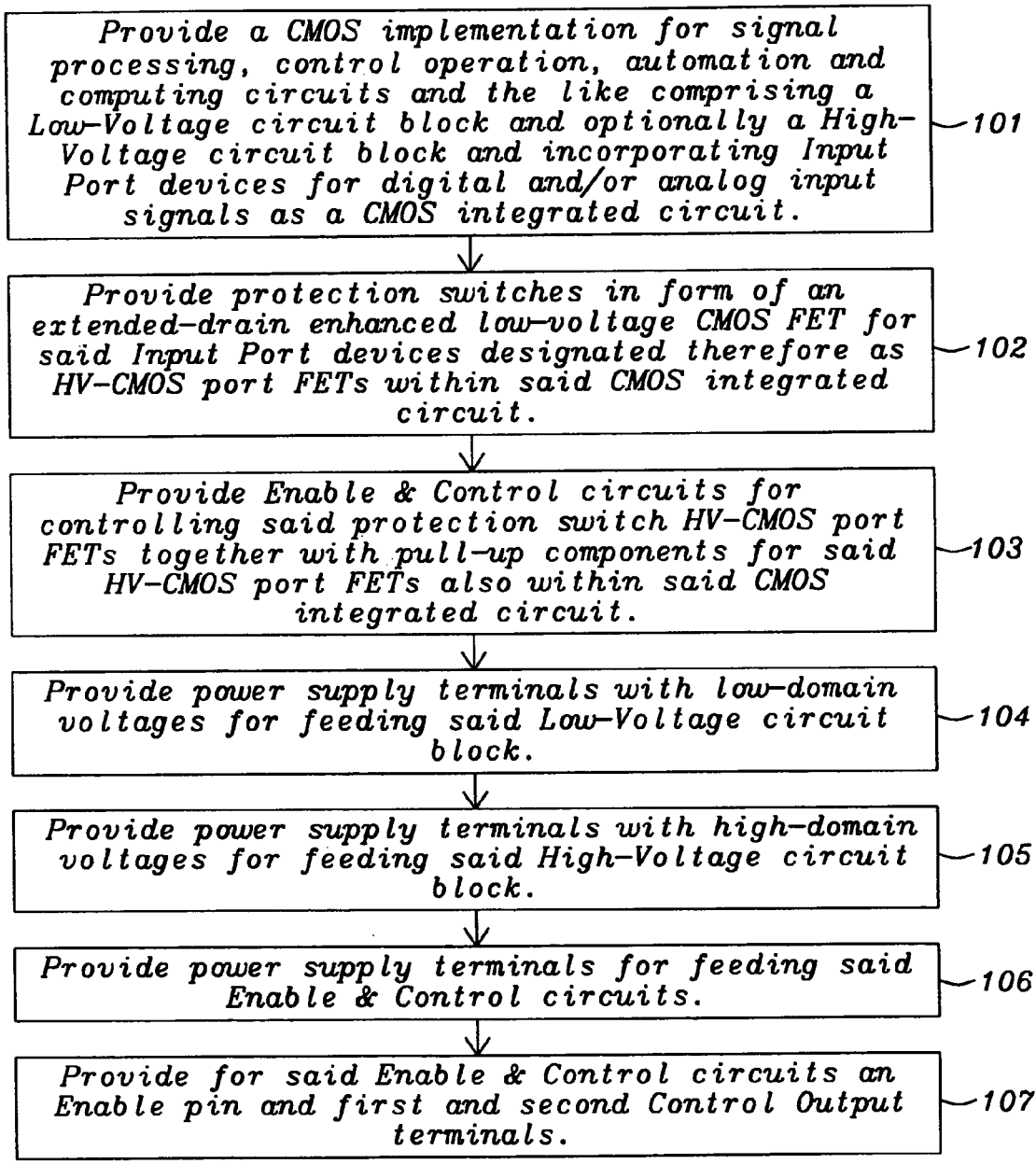
FIGS. 4A–4C describe with the help of a flow diagram the according method for building and operating a circuit containing said new input port devices of the invention as shown in FIGS. 1&2.
Figure 4B:
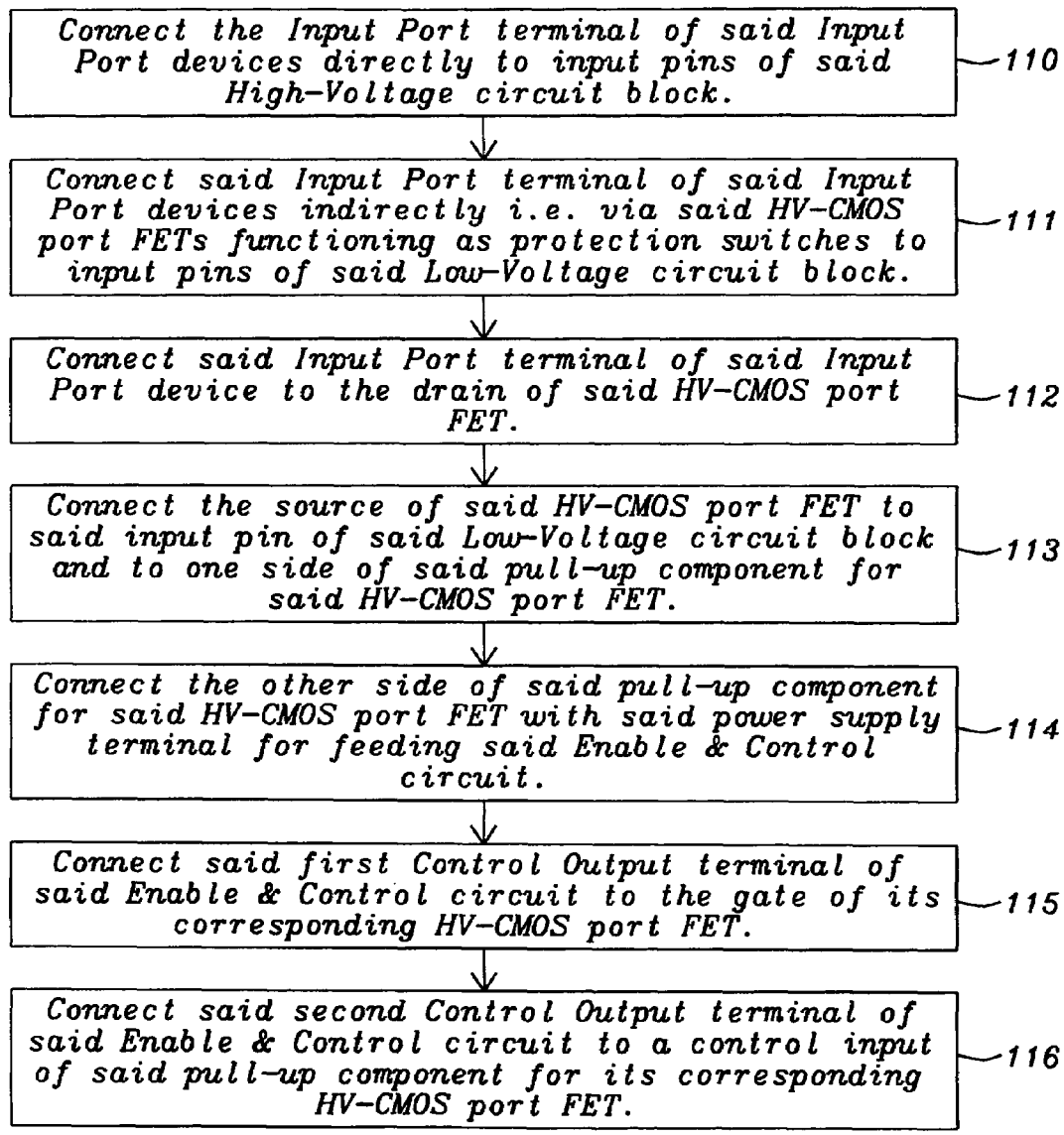
Figure 4C:
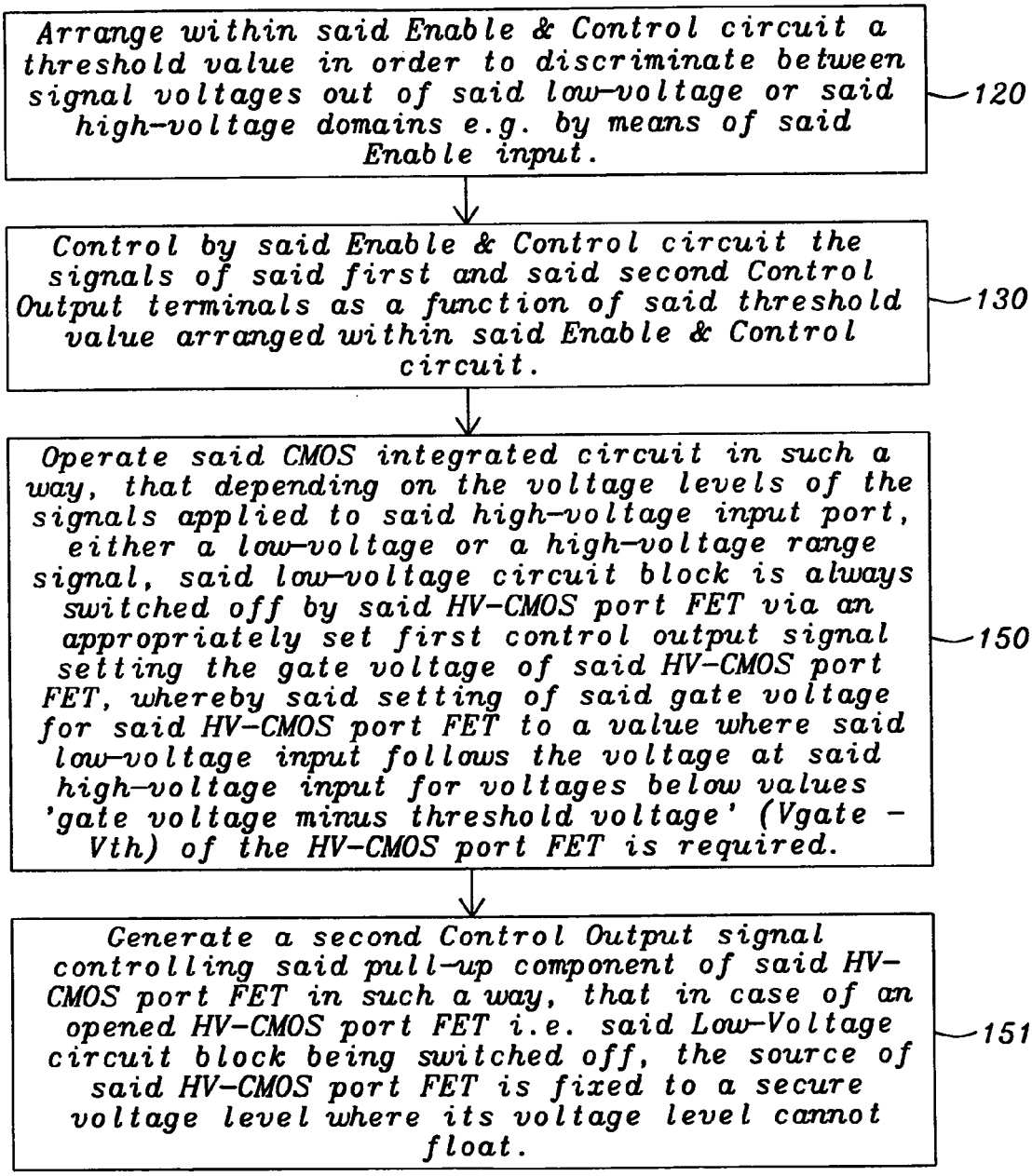

Regarding now the flow diagram given in FIGS. 4A–4C, describing a method for building a circuit for said input port devices as shown in FIG. 1 & FIG. 2 and explaining the operation of the novel circuit for such devices according to the invention is now presented and defined by its steps, wherein beginning with the first step 101 a CMOS implementation for signal processing, control operation, automation and computing circuits and the like comprising a Low-Voltage circuit block and optionally a High-Voltage circuit block and incorporating Input Port devices for digital and/or analog input signals as a CMOS integrated circuit is provided. With step 102 providing protection switches in form of an extended-drain enhanced low-voltage CMOS FET for said Input Port devices designated therefore as HV-CMOS port FETs within said CMOS integrated circuit and with step 103 providing Enable & Control circuits for controlling said protection switch HV-CMOS port FETs together with pull-up components for said HV-CMOS port FETs also within said CMOS integrated circuit the essential circuit parts of the invention are defined. By following steps 104, 105, and 106 the needed power supply terminals with low-domain voltages for feeding said Low-Voltage circuit block, the needed power supply terminals with high-domain voltages for feeding said High-Voltage circuit block, and the needed power supply terminals for feeding said Enable & Control circuits are provided. Another step 107 provides for said Enable & Control circuits an Enable pin and first and second Control Output terminals. All the following seven steps 110 . . . 116 are serving for connection purposes, connecting the Input Port terminal of said Input Port devices directly to input pins of said High-Voltage circuit block, connecting said Input Port terminal of said Input Port devices indirectly i.e. via said HV-CMOS port FETs functioning as protection switches to input pins of said Low-Voltage circuit block, connecting said Input Port terminal of said Input Port device to the drain of said HV-CMOS port FET, connecting the source of said HV-CMOS port FET to said input pin of said Low-Voltage circuit block and to one side of said pull-up component for said HV-CMOS port FET, connecting the other side of said pull-up component for said HV-CMOS port FET with said power supply terminal for feeding said Enable & Control circuit, connecting said first Control Output terminal of said Enable & Control circuit to the gate of its corresponding HV-CMOS port FET, and finally connecting said second Control Output terminal of said Enable & Control circuit to a control input of said pull-up component for its corresponding HV-CMOS port FET. Step 120 arranges within said Enable & Control circuit a threshold value in order to discriminate between signal voltages out of said low-voltage or said high-voltage domains e.g. by means of said Enable input. Step 130 now controls by said Enable & Control circuit the signals of said first and said second Control Output terminals as a function of said threshold value arranged within said Enable & Control circuit. In step 150 of the method given said CMOS integrated circuit is operated in such a way, that depending on the voltage levels of the signals applied to said high Voltage Input Port—determined by quasi monitoring and controlling said signal voltage levels itself at said drain of said HV-CMOS port FET which is gate controlled via said Enable & Control circuit or/and determined by a controller timing schedule introduced e.g. via said Enable connection to said Enable & Control circuit—said Low-Voltage circuit block is always switched off by said HV-CMOS port FET in case a High Voltage Input Port signal out of said high-voltage domain is applied. Within the last step 151 a second Control Output signal is generated, controlling said pull-up component of said HV-CMOS port FET in such a way, that in case of an opened HV-CMOS port FET i.e. said Low-Voltage circuit block being switched off, the source of said HV-CMOS port FET is fixed to a secure voltage state where its voltage level cannot float.

Summarizing the essential operational features of the circuit we find, that the circuit of the present invention implements a method, whereby a protection switch FET effectively couples a high voltage input (drain side of said FET) within a high voltage domain to the protected low voltage domain (source side of said FET) by controlling the gate voltage of said FET.

In this context however it shall at least be mentioned, that it is possible to extend the invention being also valid for analog input signals, whereby one would have to limit the range of the analog input signals and furthermore one would have to leave out the pull-up circuit, which is especially built in for the following digital CMOS inputs, taking care not to distort the analog input signals. Furthermore it shall be mentioned, that the existence of an internal high-voltage circuit part is no prerequisite for an implementation of a circuit according to the invention, as long as externally high-voltage levels are being existent in the high-voltage domain.

As shown in the preferred embodiments and evaluated by circuit analysis, the novel system, circuits and methods provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, capable of realizing an electronic system for combined usage at differing voltage ranges as defined by a low-voltage range or domain for operating standard CMOS devices and a high-voltage range or domain providing voltages exceeding said standard CMOS low-voltage operating range significantly, comprising:
   a low-voltage circuit block being operated at said low-voltage domain and having a low-voltage input and a low-voltage output;
   a high-voltage input port or terminal for input signals including voltages up to said high-voltage range thus operating in said high-voltage domain;
   a protection switch in form of an extended-drain enhanced low-voltage CMOS FET for said high-voltage input port and designated as HV-CMOS port FET connected with its drain to said high-voltage input and with its source to said low-voltage input;
   a gate voltage circuit for setting the gate voltage of said HV-CMOS port FET and connected to said gate of said HV-CMOS port FET;
   a pull-up circuit or component for clamping the source voltage of said HV-CMOS port FET to a secure state in case said HV-CMOS port FET is switched off and thus connected to said source of said HV-CMOS port FET;
   an enable circuit for controlling said pull-up component for said HV-CMOS port FET and thus connected on one side to said pull-up circuit or component and on another side to enable LV circuit components;
   power supply terminals providing low-domain voltages for feeding said gate voltage, said enable, and said low-voltage circuit blocks as well as said pull-up circuit or component;
   ground terminals for said circuits and components; and
   the setting of said gate voltage for said HV-CMOS port FET to a value where said low-voltage input follows the voltage at said high-voltage input for voltages below values 'gate voltage minus threshold voltage' (Vgate−Vth) of the HV-CMOS port FET.

2. The circuit according to claim 1 wherein said high-voltage range exceeding said standard CMOS low-voltage operating range significantly is exceeding the low-voltage range by multiples.

3. The circuit according to claim 1 where said low-voltage circuit block includes a Schmitt-Trigger circuit being connected with its input to said low-voltage input and its output to said low-voltage output.

4. The circuit according to claim 1 wherein said HV-CMOS port FET is implemented as MOS-FET.

5. The circuit according to claim 4 wherein said MOS-FET is manufactured in CMOS technology as extended drain FET with an N-well technique.

6. A circuit, realizing an electronic system for combined usage at differing voltage ranges as defined by a low-voltage range for operating standard CMOS devices and a high-voltage range exceeding said standard CMOS low-voltage operating range significantly, comprising:
   a low-voltage circuit block being operated at said low-voltage range;
   a high-voltage input port or terminal for input signals including voltages up to said high-voltage range;
   a high-voltage circuit block being operated at said high-voltage range;
   a protection switch in form of an extended-drain enhanced low-voltage CMOS FET for said high-voltage input port and designated as HV-CMOS port FET;

an enable & control circuit for gate controlling said HV-CMOS port FET;

a pull-up component for said HV-CMOS port FET;

power supply terminals providing low-domain voltages for feeding said low-voltage circuit block;

power supply terminals for feeding said high-voltage circuit block;

power supply terminals for feeding said enable & control circuit;

ground terminals for circuit components;

an enable pin and first and second control output terminals for said enable & control circuit; and wirings connecting the high-voltage input terminal directly to the input of said high-voltage circuit block, connecting said high-voltage input terminal indirectly via said HV-CMOS port FETs functioning as protection switches to the input of said low-voltage circuit block, connecting said high-voltage input terminal to the drain of said HV-CMOS port FET, connecting the source of said HV-CMOS port FET to said input pin of said low-voltage circuit block and to one side of said pull-up component for said HV-CMOS port FET, connecting the other side of said pull-up component for said HV-CMOS port FET with said power supply terminal for feeding said enable & control circuit, connecting said first control output terminal of said enable & control circuit to the gate of its corresponding HV-CMOS port FET, and finally connecting said second control output terminal of said enable & control circuit to a control input of said pull-up component for its corresponding HV-CMOS port FET.

7. The circuit according to claim 6 wherein said high-voltage range exceeding said standard CMOS low-voltage operating range significantly is exceeding the low-voltage range by multiples.

8. The circuit according to claim 6 wherein said power supply terminals for feeding said high-voltage circuit block provide high-domain voltages.

9. The circuit according to claim 6 wherein said power supply terminals for feeding said high-voltage circuit block provide low-domain voltages.

10. The circuit according to claim 6 wherein supply voltages for high-voltage circuit parts are generated internally out of low-voltage domain supply voltages.

11. The circuit according to claim 10 wherein said supply voltage generation is achieved with the help of charge-pump technology.

12. The circuit according to claim 6 wherein said HV-CMOS port FET is implemented as MOS-FET.

13. The circuit according to claim 12 wherein said MOS-FET is manufactured in CMOS technology as extended drain FET with an N-well technique.

14. The circuit according to claim 6 wherein said HV-CMOS port FET is implemented as P-channel MOS-FET.

15. The circuit according to claim 14 wherein said P-channel MOS-FET is manufactured in CMOS technology as extended drain FET with a P-well technique embedded in a deep N-well.

16. The circuit according to claim 6 wherein said pull-up component is realized as a resistive component.

17. The circuit according to claim 6 wherein said pull-up component is realized with the help of semiconductor components.

18. The circuit according to claim 6 wherein said enable pin for said enable & control circuit is externally connected.

19. The circuit according to claim 6 wherein said control I/O pin for said enable & control circuit is internally connected to said input terminal of said input port device.

20. The circuit according to claim 6 manufactured using modern integrated circuit technologies.

21. The circuit according to claim 6 manufactured as a monolithic integrated circuit.

22. The circuit according to claim 6 manufactured as integrated circuit in monolithic CMOS technology.

23. The circuit according to claim 6 manufactured as integrated circuit in standard monolithic CMOS technology.

24. A method implementing an electronic system for combined usage at differing voltage ranges or domains as defined by a low-voltage range for operating standard CMOS devices and a high-voltage range exceeding said standard CMOS low-voltage operating range significantly, comprising:

providing a low-voltage circuit block being operated at said low-voltage range;

providing optionally a high-voltage circuit block being operated at said high-voltage range;

providing a high-voltage input port or terminal for input signals including voltages up to said high-voltage range;

providing a protection switch in form of an extended-drain enhanced low-voltage CMOS FET for said high-voltage input port devices and designated as HV-CMOS port FET;

providing an enable & control circuit for controlling said protection switch HV-CMOS port FET by gate controlling said HV-CMOS port FET together with pull-up components for said HV-CMOS port FET;

providing power supply terminals with low-domain voltages for feeding said low-voltage circuit block;

providing power supply terminals with voltages for feeding said high-voltage circuit block;

providing power supply terminals for feeding said enable & control circuits;

providing for said enable & control circuit an enable pin and first and second control output terminals;

connecting the input terminal of said high-voltage input port directly to input pins of said high-voltage circuit block;

connecting said input terminal of said input port devices indirectly via said HV-CMOS port FET functioning as protection switch to input pins of said low-voltage circuit block;

connecting said high-voltage input terminal of said high-voltage input port to the drain of said HV-CMOS port FET;

connecting the source of said HV-CMOS port FET to said input pin of said low-voltage circuit block and to one side of said pull-up component for said HV-CMOS port FET;

connecting the other side of said pull-up component for said HV-CMOS port FET with said power supply terminal for feeding said enable & control circuit;

connecting said first control output terminal of said enable & control circuit to the gate of its corresponding HV-CMOS port FET;

connecting said second control output terminal of said enable & control circuit to a control input of said pull-up component for its corresponding HV-CMOS port FET;

arranging within said enable & control circuit a threshold value in order to discriminate between signal voltages out of said low-voltage or said high-voltage domains;

controlling by said enable & control circuit the signals of said first and said second control output terminals as a function of said threshold value arranged within said enable & control circuit;

operating said CMOS integrated circuit in such a way, that depending on the voltage levels of the signals applied to said high-voltage input port, either a low-voltage or a high-voltage range signal, said low-voltage circuit block is always switched off by said HV-CMOS port FET via an appropriately set first control output signal setting the gate voltage of said HV-CMOS port FET, whereby said setting of said gate voltage for said HV-CMOS port FET to a value where said low-voltage input follows the voltage at said high-voltage input for voltages below values 'gate voltage minus threshold voltage' (Vgate−Vth) of the HV-CMOS port FET is required; and generating a second control output signal controlling said pull-up component of said HV-CMOS port FET in such a way, that in case of an opened HV-CMOS port FET when said low-voltage circuit block is being switched off, the source of said HV-CMOS port FET is fixed to a secure voltage state where its voltage level cannot float.

25. The method according to claim 24 wherein said high-voltage range exceeding said standard CMOS low-voltage operating range significantly is exceeding the low-voltage range by multiples.

* * * * *